(12) United States Patent
Wang et al.

(10) Patent No.: US 9,608,573 B2
(45) Date of Patent: Mar. 28, 2017

(54) BALANCED DOHERTY POWER AMPLIFIER CIRCUIT AND RADIO TRANSMITTER

(71) Applicant: Huawei Technologies Co., Ltd., Shenzhen (CN)

(72) Inventors: Kun Wang, Shenzhen (CN); Yongge Su, Shenzhen (CN); Laiqing Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/047,888

(22) Filed: Feb. 19, 2016

(65) Prior Publication Data

US 2016/0164472 A1 Jun. 9, 2016

Related U.S. Application Data

(63) Continuation of application No. PCT/CN2013/081927, filed on Aug. 21, 2013.

(51) Int. Cl.
*H03F 3/68* (2006.01)
*H03F 1/02* (2006.01)
(Continued)

(52) U.S. Cl.
CPC .............. *H03F 1/0288* (2013.01); *H03F 1/56* (2013.01); *H03F 3/19* (2013.01); *H03F 3/211* (2013.01);
(Continued)

(58) Field of Classification Search
CPC . H03F 3/68; H03F 3/211; H03F 3/602; H03F 3/605; H03F 1/0288; H03F 1/07;
(Continued)

(56) References Cited

U.S. PATENT DOCUMENTS 7,262,656 B2 * 8/2007 Shiikuma ................ H03F 3/602
330/124 R
7,301,395 B2 * 11/2007 Mobbs .................. H03F 1/0288
330/124 R
(Continued)

FOREIGN PATENT DOCUMENTS

CN 1943106 A 4/2007
CN 101783652 A 7/2010
(Continued)

*Primary Examiner* — Khanh V Nguyen
(74) *Attorney, Agent, or Firm* — Slater Matsil, LLP

(57) ABSTRACT

A balanced Doherty power amplifier circuit and a radio transmitter is provided. The circuit includes a first peak amplifier, where an input end of the first peak amplifier is connected to a first input end of the circuit, and a first mean amplifier, where an input end of the first mean amplifier is connected to a second input end of the circuit, and an output end of the first mean amplifier is connected to an input end of a first matching unit. The circuit also includes a second peak amplifier, where an input end of the second peak amplifier is connected to the first input end of the circuit; and a second mean amplifier, where an input end of the second mean amplifier is connected to the second input end of the circuit, and an output end of the second mean amplifier is connected to an input end of the second matching unit.

6 Claims, 2 Drawing Sheets

(51) Int. Cl.
*H03F 3/60* (2006.01)
*H03F 1/56* (2006.01)
*H03F 3/19* (2006.01)
*H03F 3/21* (2006.01)
*H04B 1/04* (2006.01)
*H03F 1/07* (2006.01)

(52) U.S. Cl.
CPC ........... *H03F 3/602* (2013.01); *H04B 1/0475* (2013.01); *H03F 1/07* (2013.01); *H03F 3/68* (2013.01); *H03F 2200/321* (2013.01); *H03F 2200/387* (2013.01); *H03F 2200/451* (2013.01); *H03F 2203/21106* (2013.01); *H04B 2001/0416* (2013.01); *Y02B 60/50* (2013.01)

(58) Field of Classification Search
CPC ............ H03F 2200/06; H03F 2200/09; H03F 2200/222; H03F 3/191; H03F 2200/318; H03H 7/42
USPC .............................. 330/124 R, 295, 302, 301
See application file for complete search history.

(56) References Cited

U.S. PATENT DOCUMENTS

| | | | | |
|---|---|---|---|---|
| 8,487,703 | B2* | 7/2013 | Blednov | H01L 23/64 |
| | | | | 330/124 R |
| 8,581,665 | B2* | 11/2013 | Ui | H03F 1/0288 |
| | | | | 330/124 R |
| 2007/0205827 | A1 | 9/2007 | Mobbs | |
| 2010/0176885 | A1 | 7/2010 | Kim et al. | |
| 2011/0140775 | A1* | 6/2011 | Hong | H03F 1/0288 |
| | | | | 330/124 R |
| 2011/0175677 | A1* | 7/2011 | Jeong | H03F 1/0288 |
| | | | | 330/124 R |
| 2013/0135044 | A1 | 5/2013 | Schenk | |
| 2014/0306765 | A1 | 10/2014 | Zhang et al. | |

FOREIGN PATENT DOCUMENTS

| | | |
|---|---|---|
| CN | 102427332 A | 4/2012 |
| DE | 102010034067 A1 | 2/2012 |
| WO | 2009009987 A1 | 1/2009 |

* cited by examiner

BALANCED DOHERTY POWER AMPLIFIER CIRCUIT AND RADIO TRANSMITTER

This application is a continuation of International Application No. PCT/CN2013/081927, filed on Aug. 21, 2013, which is hereby incorporated by reference in its entirety.

TECHNICAL FIELD

The present application relates to the field of wireless communication technologies, and in particular, to a balanced Doherty power amplifier circuit and a radio transmitter.

BACKGROUND

In a wireless communication technology, a power amplifier circuit is located at a front end of an emitter, and is used to implement signal amplification, so as to meet a power requirement for a transmitted signal. To meet a requirement on high power, as shown in FIG. 1, an existing power amplifier circuit is a balanced Doherty power amplifier circuit, which is equivalent to two Doherty amplifiers 1. In each Doherty amplifier 1, an input end of a peak amplifier P is connected to an input end of the power amplifier circuit by using a one-fourth wavelength line 2, and an input end of a mean amplifier M is connected to an input end of the power amplifier. That is, a same input signal is input to two peak amplifiers and two mean amplifiers. A working principle of the balanced Doherty power amplifier circuit lies in active-load pulling, where load impedance of the mean amplifier M and the peak amplifier P changes with different power of an input signal. Specifically, when input power is low and the peak amplifier P is not working, because of an impedance transformation function of the one-fourth wavelength line, a load corresponding to the mean amplifier M is 100 ohms; compared with a working condition with a load of 50 ohms, saturated output power of the mean amplifier M is reduced by 3 dB, and efficiency is relatively high in a case of low power output. When the input power increases, the peak amplifier P starts to work, and the load of the mean amplifier M changes from 100 ohms to 50 ohms; in a case in which an output peak voltage remains in a saturated state, the output power gradually increases and efficiency of the mean amplifier M is still high; the load of the peak amplifier P changes from infinity to 50 ohms. When the input power continues to increase until both the mean amplifier M and the peak amplifier P reach their peak power, both the load corresponding to the mean amplifier M and that corresponding to the peak amplifier P are 50 ohms. A matching unit in the figure is configured for load matching in a signal amplification process.

However, because working processes of the peak amplifier and the mean amplifier, as well as the devices themselves, are different, time delays, phases, or working statuses of two branches in each Doherty amplifier cannot precisely match; as a result, efficiency of the entire power amplifier circuit is reduced.

SUMMARY

The present application provides a balanced Doherty power amplifier circuit and a radio transmitter, which increases efficiency of a power amplifier circuit.

To resolve the foregoing technical problem, the following technical solutions are used in the present application.

According to one aspect, a balanced Doherty power amplifier circuit is provided. The circuit includes a first peak amplifier, where an input end of the first peak amplifier is connected to a first input end of the balanced Doherty power amplifier circuit and a first matching unit, where an input end of the first matching unit is connected to an output end of the first peak amplifier, and an output end of the first matching unit is connected to an output end of the balanced Doherty power amplifier circuit. The circuit also includes a first mean amplifier, where an input end of the first mean amplifier is connected to a second input end of the balanced Doherty power amplifier circuit, and an output end of the first mean amplifier is connected to the input end of the first matching unit by using a one-fourth wavelength line. The circuit also includes a second peak amplifier, where an input end of the second peak amplifier is connected to the first input end of the balanced Doherty power amplifier circuit. The circuit also includes a second matching unit, where an input end of the second matching unit is connected to an output end of the second peak amplifier, and an output end of the second matching unit is connected to the output end of the balanced Doherty power amplifier circuit; and a second mean amplifier, where an input end of the second mean amplifier is connected to the second input end of the balanced Doherty power amplifier circuit, and an output end of the second mean amplifier is connected to the input end of the second matching unit by using a one-fourth wavelength line.

Optionally, the input end of the first peak amplifier is connected to the first input end of the balanced Doherty power amplifier circuit by using a one-fourth wavelength line; and the input end of the second peak amplifier is connected to the first input end of the balanced Doherty power amplifier circuit by using a one-fourth wavelength line.

According to another aspect, a radio transmitter is provided. The radio transmitter includes a digital domain signal processing module and the foregoing balanced Doherty power amplifier circuit. The digital domain signal processing module is connected to a first input end and a second input end of the balanced Doherty power amplifier circuit, and is configured to provide an input signal that matches the balanced Doherty power amplifier circuit.

According to the balanced Doherty power amplifier circuit and the radio transmitter that are provided in the present application, a peak amplifier and a mean amplifier in the balanced Doherty power amplifier circuit receive different input signals, so that two channels of input signals can be first processed separately to implement matching and optimization of the peak amplifier and the mean amplifier, thereby increasing efficiency of the balanced Doherty power amplifier circuit.

BRIEF DESCRIPTION OF THE DRAWINGS

To describe the technical solutions in the embodiments of the present application or in the prior art more clearly, the following briefly introduces the accompanying drawings required for describing the embodiments or the prior art. Apparently, the accompanying drawings in the following description show merely some embodiments of the present application, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present application with reference to the accompanying drawings in the embodiments of the present application. Apparently, the described embodiments are merely some but not all of the embodiments of the present application. All other embodiments obtained by a person of ordinary skill in the art based on the embodiments of the present application without creative efforts shall fall within the protection scope of the present application.

Figure 1:
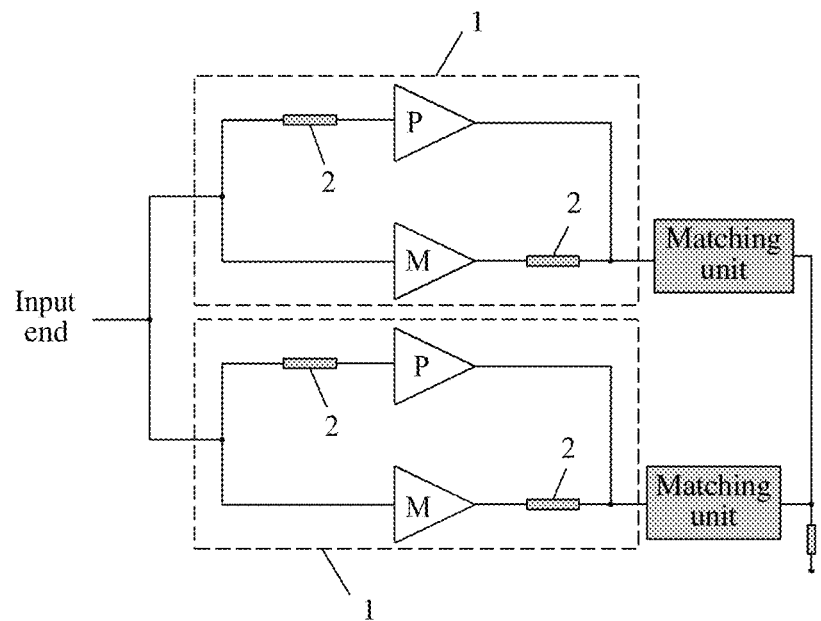
FIG. 1 is a schematic structural diagram of a balanced Doherty power amplifier circuit in the prior art.
Figure 2:
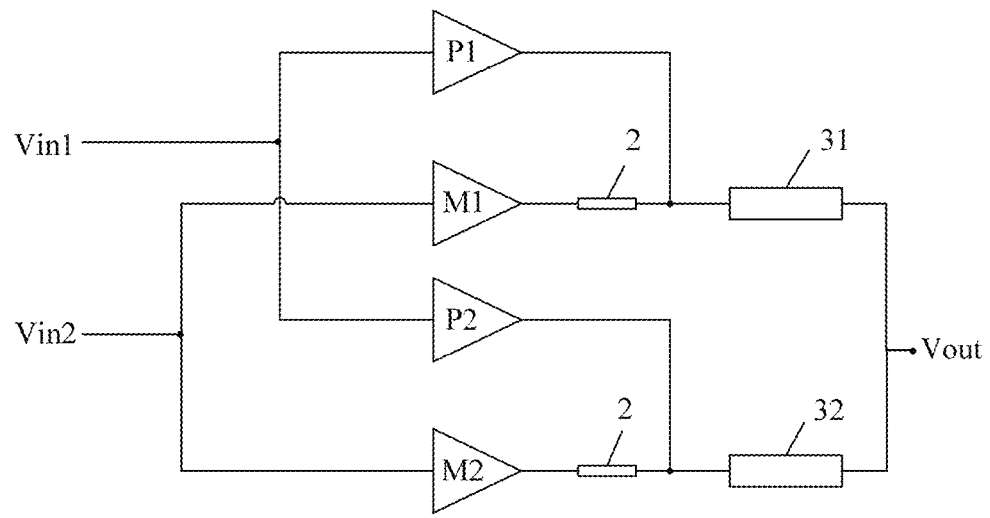
FIG. 2 is a schematic structural diagram of a balanced Doherty power amplifier circuit according to an embodiment of the present application.

As shown in FIG. 2, an embodiment of the present application provides a balanced Doherty power amplifier circuit, including: a first peak amplifier P1, where an input end of the first peak amplifier P1 is connected to a first input end Vin1 of the balanced Doherty power amplifier circuit; a first matching unit 31, where an input end of the first matching unit 31 is connected to an output end of the first peak amplifier P1, and an output end of the first matching unit 31 is connected to an output end Vout of the balanced Doherty power amplifier circuit; a first mean amplifier M1, where an input end of the first mean amplifier M1 is connected to a second input end Vin2 of the balanced Doherty power amplifier circuit, and an output end of the first mean amplifier M1 is connected to the input end of the first matching unit 31 by using a one-fourth wavelength line 2; a second peak amplifier P2, where an input end of the second peak amplifier P2 is connected to the first input end Vin1 of the balanced Doherty power amplifier circuit; a second matching unit 32, where an input end of the second matching unit 32 is connected to an output end of the second peak amplifier P2, and an output end of the second matching unit 32 is connected to the output end Vout of the balanced Doherty power amplifier circuit; and a second mean amplifier M2, where an input end of the second mean amplifier M2 is connected to the second input end Vin2 of the balanced Doherty power amplifier circuit, and an output end of the second mean amplifier M2 is connected to the input end of the second matching unit 32 by using a one-fourth wavelength line 2.

Specifically, a branch at which the first peak amplifier P1 is located and a branch at which the first mean amplifier M1 is located form a Doherty amplifier; a branch at which the second peak amplifier P2 is located and a branch at which the second mean amplifier M2 is located form another Doherty amplifier. A specific working principle of the balanced Doherty power amplifier circuit is similar to that in the prior art, and an only difference lies in that: because the two peak amplifiers are connected to a same input end, and the two mean amplifiers are connected to another input end, the peak amplifiers and the mean amplifiers separately receive different input signals. A peak amplifier and a mean amplifier in the prior art can only receive a same input signal, and therefore a one-fourth wavelength line needs to be disposed at an input end of each peak amplifier to perform impedance transformation. However, in this embodiment, because a peak amplifier and a mean amplifier separately receive two different channels of input signals, impedance transformation may be first performed, by using a digital domain signal processing module, on a signal that needs to enter the peak amplifier, and then the signal that undergoes impedance transformation is input to the first input end Vin1 of the balanced Doherty power amplifier circuit, without disposing a one-fourth wavelength line at an input end of the peak amplifier. In addition, working processes of the peak amplifier and the mean amplifier, as well as the devices themselves, are different, and the peak amplifier and the mean amplifier in the prior art receive a same input signal; therefore, the mean amplifier is over-pushed after the mean amplifier reaches a saturation point, a peak tube works in an under-saturated state or over-saturated state because an input power of the peak tube cannot be precisely controlled, and time delays and phases of the peak amplifier and the mean amplifier are inconsistent. The foregoing problems cause an efficiency decrease of an entire balanced Doherty power amplifier circuit. However, for the balanced Doherty power amplifier circuit in this embodiment, according to differences of working processes of the peak amplifier and the mean amplifier and the devices themselves, two channels of input signals are separately processed by a digital domain signal processing module, so as to change time delays and phases of the peak amplifier and the mean amplifier or change a switching characteristic, and the like of the peak amplifier. That is, the two channels of signals are processed, so as to implement matching and optimization of the peak amplifier and the mean amplifier, thereby increasing efficiency of the balanced Doherty power amplifier circuit. In addition, because only single input is changed to dual input, and a basic principle and a working process of the balanced Doherty power amplifier circuit remain unchanged, it is ensured that linear performance does not deteriorate.

According to the balanced Doherty power amplifier circuit in this embodiment of the present application, a peak amplifier and a mean amplifier receive different input signals, so that two channels of input signals can be first processed separately to implement matching and optimization of the peak amplifier and the mean amplifier, thereby increasing efficiency of the balanced Doherty power amplifier circuit.

Figure 3:
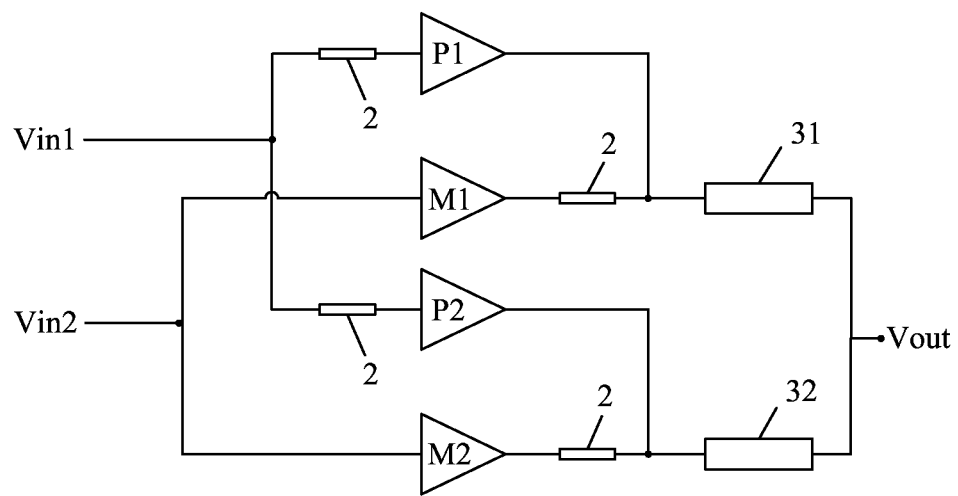
FIG. 3 is a schematic structural diagram of another balanced Doherty power amplifier circuit according to an embodiment of the present application.

As shown in FIG. 3, optionally, the input end of the first peak amplifier P1 is connected to the first input end Vin1 of the balanced Doherty power amplifier circuit by using a one-fourth wavelength line 2; and the input end of the second peak amplifier P2 is connected to the first input end Vin1 of the balanced Doherty power amplifier circuit by using a one-fourth wavelength line 2.

Another specific structure of the balanced Doherty power amplifier circuit is the same as that in the foregoing embodiment; a working process of the circuit is similar to that in the foregoing embodiment, and an only difference lies in that: the peak amplifier can perform impedance transformation by using a one-fourth wavelength line 2, without requiring a digital domain signal processing module to perform impedance transformation processing on an input signal.

According to the balanced Doherty power amplifier circuit in this embodiment of the present application, a peak amplifier and a mean amplifier receive different input signals, so that two channels of input signals can be first processed separately to implement matching and optimization of the peak amplifier and the mean amplifier, thereby increasing efficiency of the balanced Doherty power amplifier circuit.

Figure 4:
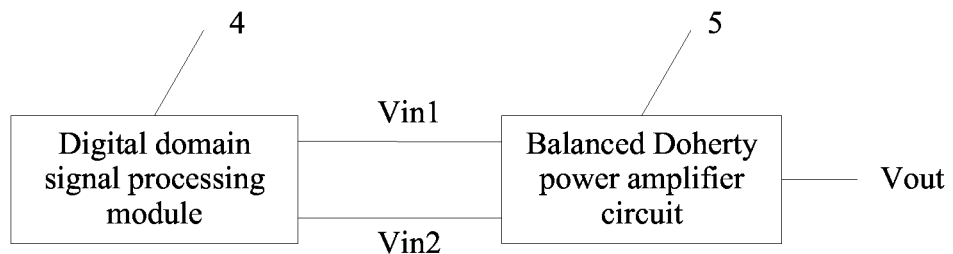
FIG. 4 is a structural block diagram of a radio transmitter according to an embodiment of the present application.

As shown in FIG. 4, an embodiment of the present application further provides a radio transmitter, including a digital domain signal processing module 4 and a balanced Doherty power amplifier circuit 5 that is described above, where the digital domain signal processing module 4 is connected to a first input end Vin1 and a second input end Vin2 of the balanced Doherty power amplifier circuit 5, and is configured to provide an input signal that matches the balanced Doherty power amplifier circuit 5. The balanced Doherty power amplifier circuit 5 amplifies the input signal, and then outputs the input signal to a device, for example, a duplexer, for transmitting.

A specific structure, a principle, and a working process of the balanced Doherty power amplifier circuit are the same as those in the foregoing embodiment, and details are not described herein again.

According to the radio transmitter in this embodiment of the present application, a peak amplifier and a mean amplifier in the balanced Doherty power amplifier circuit receive different input signals, so that two channels of input signals can be first processed separately to implement matching and optimization of the peak amplifier and the mean amplifier, thereby increasing efficiency of the balanced Doherty power amplifier circuit.

Based on the foregoing descriptions of the implementation manners, a person skilled in the art may clearly understand that the present application may be implemented by software in addition to necessary universal hardware or by hardware only. In most circumstances, the former is a preferred implementation manner.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A balanced Doherty power amplifier circuit, comprising:
   a first peak amplifier, wherein an input end of the first peak amplifier is connected to a first input end of the balanced Doherty power amplifier circuit;
   a first matching unit, wherein an input end of the first matching unit is connected to an output end of the first peak amplifier, and an output end of the first matching unit is connected to an output end of the balanced Doherty power amplifier circuit;
   a first main amplifier, wherein an input end of the first main amplifier is connected to a second input end of the balanced Doherty power amplifier circuit, and an output end of the first main amplifier is connected to the input end of the first matching unit by a one-fourth wavelength line;
   a second peak amplifier, wherein an input end of the second peak amplifier is connected to the first input end of the balanced Doherty power amplifier circuit;
   a second matching unit, wherein an input end of the second matching unit is connected to an output end of the second peak amplifier, and an output end of the second matching unit is connected to the output end of the balanced Doherty power amplifier circuit; and
   a second main amplifier, wherein an input end of the second main amplifier is connected to the second input end of the balanced Doherty power amplifier circuit, and an output end of the second main amplifier is connected to the input end of the second matching unit by a one-fourth wavelength line.

2. The balanced Doherty power amplifier circuit according to claim 1, wherein:
   the input end of the first peak amplifier is connected to the first input end of the balanced Doherty power amplifier circuit by a one-fourth wavelength line; and
   the input end of the second peak amplifier is connected to the first input end of the balanced Doherty power amplifier circuit by a one-fourth wavelength line.

3. A radio transmitter, comprising:
   a processor; and
   a balanced Doherty power amplifier circuit;
   wherein the processor is connected to a first input end and a second input end of the balanced Doherty power amplifier circuit, and is configured to provide an input signal that matches the balanced Doherty power amplifier circuit; and
   wherein the balanced Doherty power amplifier circuit comprises:
      a first peak amplifier, wherein an input end of the first peak amplifier is connected to a first input end of the balanced Doherty power amplifier circuit;
      a first matching unit, wherein an input end of the first matching unit is connected to an output end of the first peak amplifier, and an output end of the first matching unit is connected to an output end of the balanced Doherty power amplifier circuit;
      a first main amplifier, wherein an input end of the first main amplifier is connected to a second input end of the balanced Doherty power amplifier circuit, and an output end of the first main amplifier is connected to the input end of the first matching unit by a one-fourth wavelength line;
      a second peak amplifier, wherein an input end of the second peak amplifier is connected to the first input end of the balanced Doherty power amplifier circuit;
      a second matching unit, wherein an input end of the second matching unit is connected to an output end of the second peak amplifier, and an output end of the second matching unit is connected to the output end of the balanced Doherty power amplifier circuit; and
      a second main amplifier, wherein an input end of the second mean amplifier is connected to the second input end of the balanced Doherty power amplifier circuit, and an output end of the second main amplifier is connected to the input end of the second matching unit by a one-fourth wavelength line.

4. The radio transmitter according to claim 3, wherein:
   the input end of the first peak amplifier is connected to the first input end of the balanced Doherty power amplifier circuit by a one-fourth wavelength line; and
   the input end of the second peak amplifier is connected to the first input end of the balanced Doherty power amplifier circuit by a one-fourth wavelength line.

5. A method of forming a balanced Doherty power amplifier circuit, comprising:
   connecting an input end of a first peak amplifier to a first input end of the balanced Doherty power amplifier circuit;
   connecting an input end of a first matching unit to an output end of the first peak amplifier, and connecting an output end of the first matching unit to an output end of the balanced Doherty power amplifier circuit;

connecting an input end of a first main amplifier to a second input end of the balanced Doherty power amplifier circuit, and connecting an output end of the first main amplifier to the input end of the first matching unit by a one-fourth wavelength line;

connecting an input end of a second peak amplifier to the first input end of the balanced Doherty power amplifier circuit;

connecting an input end of a second matching unit to an output end of the second peak amplifier, and connecting an output end of the second matching unit to the output end of the balanced Doherty power amplifier circuit; and connecting an input end of a second main amplifier to the second input end of the balanced Doherty power amplifier circuit, and connecting an output end of the second main amplifier to the input end of the second matching unit by a one-fourth wavelength line.

6. The method according to claim 5, wherein:

the input end of the first peak amplifier is connected to the first input end of the balanced Doherty power amplifier circuit by a one-fourth wavelength line; and the input end of the second peak amplifier is connected to the first input end of the balanced Doherty power amplifier circuit by a one-fourth wavelength line.

* * * * *

UNITED STATES PATENT AND TRADEMARK OFFICE
CERTIFICATE OF CORRECTION

PATENT NO. : 9,608,573 B2
APPLICATION NO. : 15/047888
DATED : March 28, 2017
INVENTOR(S) : Kun Wang et al.

It is certified that error appears in the above-identified patent and that said Letters Patent is hereby corrected as shown below:

In the Claims

In Column 6, Line 49, Claim 3, delete "mean" and insert --main--.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*